(12) United States Patent
Yonemaru

(10) Patent No.: US 7,880,126 B2
(45) Date of Patent: Feb. 1, 2011

(54) CURRENT DETECTION CIRCUIT, LIGHT RECEIVING DEVICE USING THE SAME, AND ELECTRONIC DEVICE

(75) Inventor: Masao Yonemaru, Kyoto (JP)

(73) Assignee: Rohm Co., Ltd. (JP)

( * ) Notice: Subject to any disclaimer, the term of this patent is extended or adjusted under 35 U.S.C. 154(b) by 295 days.

(21) Appl. No.: 12/089,784

(22) PCT Filed: Oct. 10, 2006

(86) PCT No.: PCT/JP2006/320229

§ 371 (c)(1),
(2), (4) Date: Apr. 10, 2008

(87) PCT Pub. No.: WO2007/043532

PCT Pub. Date: Apr. 19, 2007

(65) Prior Publication Data

US 2009/0278028 A1 Nov. 12, 2009

(30) Foreign Application Priority Data

Oct. 11, 2005 (JP) ............................. 2005-296723

(51) Int. Cl.
*H01J 40/00* (2006.01)
(52) U.S. Cl. .................................. 250/208.1; 327/333
(58) Field of Classification Search .............. 250/208.1; 327/333; 323/284
See application file for complete search history.

(56) References Cited

U.S. PATENT DOCUMENTS 5,384,516 A * 1/1995 Kawabata et al. ........... 315/160
6,785,477 B1 * 8/2004 Masuda et al. .............. 398/208

FOREIGN PATENT DOCUMENTS

| CN | 1314611 A | 9/2001 |
|---|---|---|
| JP | 5-209788 A | 8/1993 |
| JP | 2002-335133 A | 11/2002 |
| JP | 2003-198279 A | 7/2003 |
| JP | 2003-315149 A | 11/2003 |
| JP | 2005-216984 A | 8/2005 |
| JP | 2006-287295 A | 10/2006 |

OTHER PUBLICATIONS

Chinese Office Action for Chinese Patent Application No. 200680003145.0 issued Nov. 13, 2009 with English translation.
International Search Report for International Application No. PCT/JP2006/320229 mailed Jan. 16, 2007.
Written Opinion of the International Searching Authority for PCT/JP2006/320229 mailed Jan. 16, 2007.

* cited by examiner

*Primary Examiner*—Seung C Sohn
(74) *Attorney, Agent, or Firm*—Cantor Colburn LLP

(57) ABSTRACT

A first transistor is provided on a current path for a phototransistor. A first resistor is provided between one terminal of the first transistor and the power supply line. A second transistor forms a current mirror circuit in cooperation with the first transistor, which amplifies with a predetermined amplification factor the current that flows through the first transistor. A charge capacitor, one terminal of which is connected to a fixed electric potential, is charged with the current thus amplified. A second resistor is provided between one terminal of the second transistor and the power supply line.

10 Claims, 6 Drawing Sheets

CURRENT DETECTION CIRCUIT, LIGHT RECEIVING DEVICE USING THE SAME, AND ELECTRONIC DEVICE

CROSS REFERENCE TO RELATED APPLICATIONS

This is a U.S. national stage of application No. PCT/JP2006/320229, filed on 10 Oct. 2006. Priority under 35 U.S.C. §119(a) and 35 U.S.C. §365(b) is claimed from Japanese Application No. JP2005-296723, filed 11 Oct. 2005, the disclosure of which is also incorporated herein by reference.

BACKGROUND OF THE INVENTION

1. Field of the Invention

The present invention relates to a current detection circuit for detecting current that flows through a photo detector device.

2. Description of the Related Art

Various kinds of electronic devices provide a function of measurement of light input externally, and a function of performing signal processing according to the received light amount thus measured. Examples of such electronic devices include a luminescence sensor, a photo detector device employed in an infrared ray remote controller, and so forth. Examples of photo detector devices for receiving light which are widely used include a phototransistor, a photodiode, a CCD (Charge Coupled Device), etc.

Each of the phototransistor and the photodiode outputs current according to the light thus received. Accordingly, the photo detector device amplifies the current that flows through such a photo detector device, or performs signal processing such as voltage conversion. For example, Patent document 1 discloses a configuration of a photoreceptor circuit employing a computation amplifier.

[Patent Document 1]
   Japanese Patent Application Laid-open No. 2005-216984

As described in Patent document 1, in general, conventional photo detector devices have a configuration in which a resistor is serially connected to a photo detector device such as a photodiode, a phototransistor, or the like. With such conventional arrangements, signal processing is performed for the voltage at the resistor. However, such a circuit configuration has a program in which, in a case that the photocurrent that flows through the photo detector device changes, the voltage drop across the resistor changes. This leads to a change in the electric potential at the node between the photo detector device and the current detection circuit, i.e., at the cathode of the photodiode or at the collector of the phototransistor. This leads to fluctuation in the bias state of the photo detector device, resulting in a problem that the current value of the photocurrent fluctuates even in the state in which a constant light amount is input.

Also, let us consider a case in which the photocurrent increases, which leads to increased voltage drop across the resistor. In this case, the voltage is reduced between the collector and the emitter of the phototransistor, leading to a situation in which the phototransistor cannot operate. That is to say, in some cases, such a conventional arrangement limits the dynamic range.

SUMMARY OF THE INVENTION

The present invention has been made in view of such a problem. Accordingly, it is a general purpose of the present invention to provide a current detection circuit having a function of maintaining the stable bias state of a photo detector device, thereby providing stable detection of photocurrent.

An embodiment of the present invention relates to a current detection circuit for detecting current that flows through a photo detector device. The current detection circuit comprises: a first transistor provided on a current path for the photo detector device; a first resistor provided between one terminal of the first transistor and a terminal to which a fixed electric potential is applied; a second transistor which forms a current mirror circuit in cooperation with the first transistor, and which amplifies by a predetermined amplification factor the current that flows through the first transistor, and which provides the current thus amplified as the output of the current detection circuit; and a second resistor provided between one terminal of the second transistor and a terminal to which a fixed electric potential is applied.

With such an embodiment, the electric potential at a node between the photo detector device and the first transistor is maintained at an approximately constant value regardless of the magnitude of the photocurrent that flows through the photo detector device. Such an arrangement maintains the bias state, thereby providing stable detection of photocurrent.

Also, the current detection circuit may further comprise an adjusting resistor connected in parallel with the second resistor. Such an arrangement allows the impedance of the emitter side or the source side of the second transistor to be adjusted according to the type of, properties of, or irregularities in the photo detector device connected to the current detection circuit. This provides stable photocurrent detection.

Also, an arrangement may be made in which the size of the second transistor is set to a value smaller than that of the first transistor, and the resistance value of the second resistor is set to a value greater than that of the first resistor. With such an arrangement, the current mirror circuit outputs a smaller output current than the input current. Such an arrangement reduces current consumption of the circuit. Also, such an arrangement allows the capacitor used for current/voltage conversion to be designed with a reduced capacitance.

Also, a capacitor may be charged with the current that flows through the second transistor, which is output in the form of voltage thus converted. With such an arrangement, the capacitor is charged with the current output from the current mirror circuit, thereby performing integration of the photocurrent. Such an arrangement enables the light amount input to the photo detector device to be detected in the form of voltage thus converted.

Also, an arrangement may be made in which the first transistor, the second transistor, the first resistor, and the second resistor are integrally formed on a single semiconductor substrate, and the adjusting resistor is connected in the form of an external component of the semiconductor substrate. Such an arrangement allows the circuit properties to be adjusted in a manufacturing process or a testing process for a set employing the current detection circuit. This provides a method for adjusting the irregularities in the circuit properties and the phototransistors, thereby improving the yield.

Another embodiment of the present invention relates to a photo detecting apparatus. The photo detecting apparatus comprises: a photo detector device; and the aforementioned current detection circuit which detects the photocurrent that flows through the photo detector device. The photo detector device may be either a phototransistor or a photodiode.

Yet another embodiment of the present invention relates to an electronic device. The electronic device comprises: a light-emitting device; and the photo detecting apparatus which detects light that has been emitted from the light-emitting device, and that has been reflected by an external object. With such an arrangement, upon the light amount of the reflected light detected by the photo detecting apparatus reaching a predetermined value, the light-emitting device may stop light emission.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the element A and the element B are connected to each other" includes a state in which the element A and the element B are physically and directly connected to each other. Also, the state represented by such a phrase include a state in which the element A and the element B are indirectly connected to each other via another element that does not affect the electric connection between the element A and the element B, or that has only insubstantial effect on the electric connection therebetween.

Figure 1:
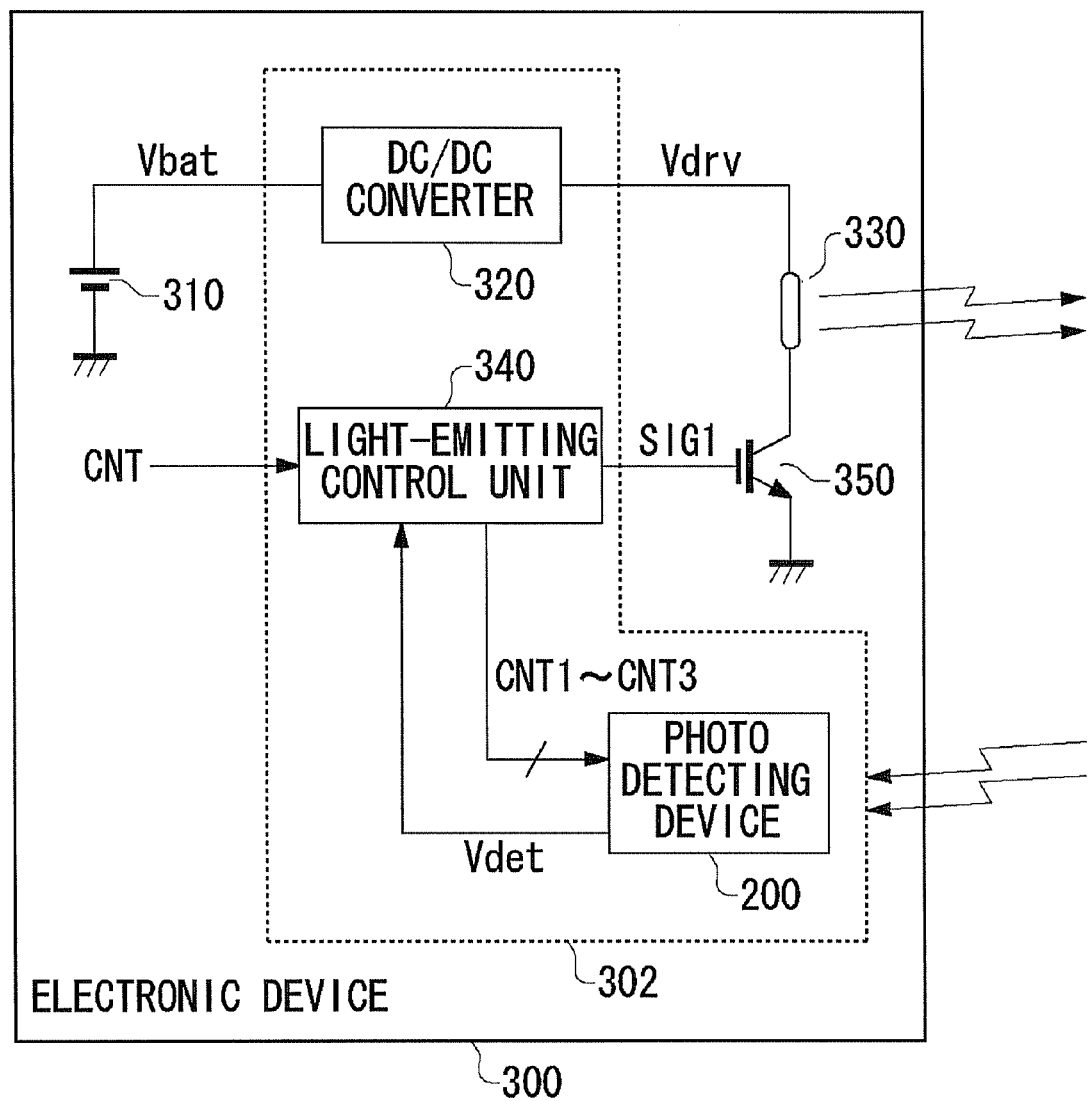
FIG. 1 is a circuit diagram which shows an electronic device according to an embodiment.

FIG. 1 is a diagram which shows a configuration of an electronic device 300 according to the present embodiment. The electronic device 300 according to the present embodiment is a cellular phone terminal with a built-in camera including a flash, for example. The electronic device 300 includes a photo detector device which detects reflected returning light after the flash has emitted light. With such an arrangement, upon detection of a predetermined light amount, the electronic device 300 instructs the flash to stop light emission.

The electronic device 300 includes a battery 310, a DC/DC converter 320, a light-emitting device 330, a light-emitting control unit 340, a light-emitting control transistor 350, and a photo detector device 200.

The battery 310 is a lithium-ion battery which outputs the battery voltage Vbat of around 3 V to 4 V. The DC/DC converter 320 boosts the battery voltage Vbat up to around 300 V. The driving voltage Vdrv generated by the DC/DC converter 320 is supplied to the light-emitting device 330.

For example, the light-emitting device 330 is a xenon tube lamp. With such an arrangement, the driving voltage Vdrv boosted up to around 300 V is applied to one terminal of the light-emitting device 330. The other terminal of the light-emitting device 330 is connected to the light-emitting control transistor 350. As the light-emitting control transistor 350, an IGBT (Insulated Gate Bipolar Transistor) or the like, which exhibits high voltage endurance, is employed. A light-emitting control signal SIG1 output from the light-emitting control unit 340 is input to the gate of the light-emitting control transistor 350.

The light-emitting control unit 340 receives a control signal CNT as an input signal. With such an arrangement, upon the user turning on the flash, the control signal CNT is switched to the high level state synchronously with the shutter timing. The light-emitting control unit 340 switches the light-emitting control signal SIG1 to the high level state according to the control signal CNT, as described later. Upon switching the light-emitting control signal SIG1 to the high level state, the light-emitting control transistor 350 is turned on after a delay time τ, thereby instructing the light-emitting device 330 to emit light. The delay time τ is dependent upon the properties of the xenon tube lamp.

On the other hand, the light-emitting control unit 340 generates a first control signal CNT1 through a third control signal CNT3 based upon the control signal CNT, and outputs these signals to the photo detector device 200. The photo detector device 200 transits to the standby state for light reception according to the first control signal CNT1 through the third control signal CNT3 output from the light-emitting control unit 340. Subsequently, the photo detector device 200 detects the light which has been emitted from the light-emitting device 330, and which has returned from an external object by reflection, and outputs the light thus detected in the form of a detection voltage Vdet. Upon the detection voltage Vdet exceeding a predetermined threshold voltage Vth, i.e., upon the amount of the reflected light thus detected reaching a predetermined light amount, the light-emitting control signal SIG1 is switched to the low level state, which instructs the light-emitting device 300 to stop light emission.

Figure 2:
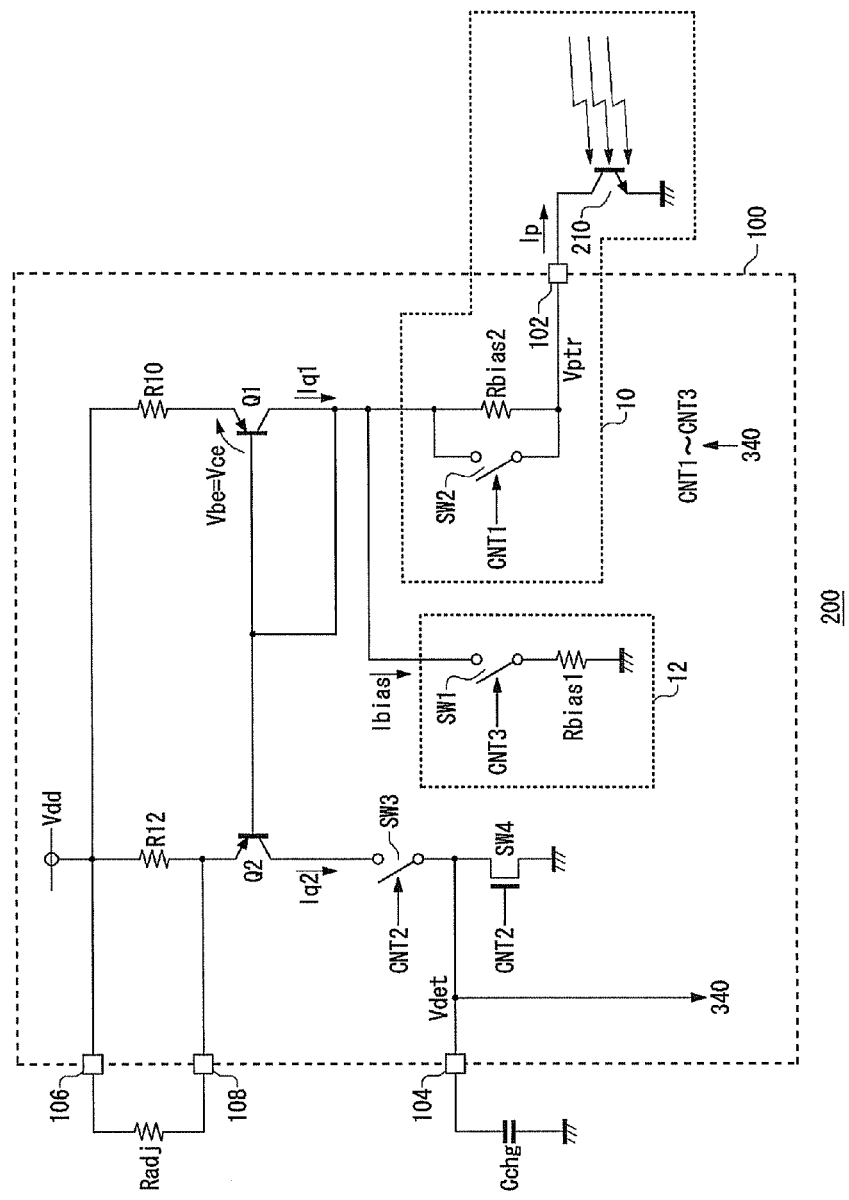
FIG. 2 is a circuit diagram which shows a configuration of a photo detector device shown in FIG. 1.

Next, detailed description will be made regarding a configuration of the photo detector device 200 according to the present embodiment. FIG. 2 is a circuit diagram which shows a configuration of the photo detector device 200 according to the present embodiment. The photo detector device 200 includes a current detection circuit 100, a phototransistor 210, a charge capacitor Cchg, and an adjusting capacitor Radj. The current detection circuit 100 is an IC which is integrally formed on a single semiconductor substrate. With the present embodiment, the current detection circuit 100 is integrally formed in the form of a function IC 302 along with the light-emitting control unit 340, the control circuit for the DC/DC converter 320, and so forth, shown in FIG. 1.

The phototransistor 210 is provided as a photo detector device, which generates the photocurrent Ip according to the input light. The emitter of the phototransistor 210 is grounded, and the collector thereof is connected to the detection terminal 102 of the current detection circuit 100.

The current detection circuit 100 detects the photocurrent Ip that flows through the phototransistor 210 connected to the detection terminal 102. The current detection circuit 100 includes a first transistor Q1, a second transistor Q2, a first bias resistor Rbias1, a second bias resistor Rbias2, a bias switch SW1, a bypass switch SW2, a first resistor R10, and a second resistor R12. Furthermore, the adjusting resistor Radj is connected between a resistor connection terminal 106 and a resistor connection terminal 108, and the charge capacitor Cchg is connected to a capacitor connection terminal 104, which are provided externally to the current detection circuit 100.

The first transistor Q1 is a PNP bipolar transistor (which will be simply referred to as "PNP transistor" hereafter), which is provided on a current path for the phototransistor 210 that serves as a photo detector device. The first resistor R10 is connected between the emitter of the first transistor Q1 and the power supply line to which the power supply voltage Vdd is applied. Furthermore, the base and the collector of the first transistor Q1 are connected to each other.

The second transistor Q2 is a PNP transistor, the base of which is connected to the base of the first transistor Q1. The second resistor R12 is provided between the emitter of the second transistor Q2 and the power supply line. Furthermore, the adjusting resistor Radj is connected in parallel with the second resistor R12. The second transistor Q2 forms a current mirror circuit in cooperation with the first transistor Q1, the first resistor R10, the second resistor R12, and the adjusting resistor Radj. With such an arrangement, the second transistor Q2 outputs a second current Iq2 which is a value obtained by multiplying, by a predetermined coefficient, the first current Iq1 that flows through the first transistor Q1. For example, the ratio of the size of the first transistor as to that of the second transistor is set to around 4:1.

The path from the collector of the first transistor Q1 to the ground via the detection terminal 102 and the phototransistor 210 will be referred to as "main current path 10". A second bias resistor Rbias2 is provided between the first transistor Q1 and the detection terminal 102 on the main current path 10. The resistor value of the second bias resistor Rbias2 is set to a sufficiently high value, e.g., to a value in a range of several MΩ to several tens of MΩ. With the present embodiment, the resistor value of the second bias resistor Rbias2 is set to 10 MΩ, as an example. Furthermore, the main current path 10 further includes the bypass switch SW2 which allows a bypass to be provided in parallel with the second bias resistor Rbias2. The bypass switch SW2 performs ON/OFF operation according to the first control signal CNT1 output from the light-emitting control unit 340.

A bias current path 12 is provided in parallel with the main current path 10. The bias current path 12 includes the first bias resistor Rbias1 and the bias switch SW1 serially connected between the collector of the first transistor Q1 and the ground. The resistor value of the first bias resistor Rbias1 is set to a sufficiently low value as compared with the second bias resistor Rbias2, e.g., to around 1/10 of the second bias resistor Rbias2. The resistor value of the first bias resistor Rbias1 is set to 1 MΩ, for example.

The bias switch SW1 performs ON/OFF operation according to the third control signal CNT3 generated by the light-emitting control unit 340. Upon turning on the bias switch SW1, the bias current path 12 is switched to the ON state, thereby allowing the current to flow through the bias current path 12. The current that flows through the bias current path 12 will be referred to as "bias current Ibias" hereafter.

The collector of the second transistor Q2 is connected to the capacitor connection terminal 104 via a mask switch SW3. With the current detection circuit 100, the charge capacitor Cchg is charged with the second current Iq2 that flows through the second transistor Q2, thereby converting the second current Iq2 into voltage. The mask switch SW3 performs ON/OFF operation according to the second control signal CNT2 generated by the light-emitting control unit 340. Specifically, upon the second control signal CNT2 switching to the high level state, the mask switch SW3 is switched to the OFF state. On the other hand, upon the second control signal CNT2 switching to the low level state, the mask switch SW3 is switched to the ON state. Upon turning off the mask switch SW3, the path for the second current Iq2 is switched to the OFF state, which stops charging of the charge capacitor Cchg.

Furthermore, a discharge switch SW4 is provided between the capacitor connection terminal 104 and the ground. The discharge switch SW4 is an NMOS transistor, which is connected in parallel with the charge capacitor Cchg. With regard to the discharge switch SW4, the drain thereof is connected to the capacitor connection terminal 104, and the source thereof is grounded. Furthermore, the second control signal CNT2, which is generated by the light-emitting control unit 340, is input to the gate of the discharge switch SW4. With such an arrangement, upon switching the second control signal CNT2 to the high level state, the discharge switch SW4 is switched to the ON state. On the other hand, upon switching the second control signal CNT2 to the low level state, the discharge switch SW4 is switched to the OFF state. Upon turning on the charge switch SW4, the capacitor connection terminal 104 is grounded, thereby releasing the charge stored in the charge capacitor Cchg. As described later, prior to the start of the light reception operation of the phototransistor 210, the discharge switch SW4 is turned on for a predetermined period of time ΔT1 according to the second control signal CNT2. The discharge switch SW4 and the mask switch SW3 operate ON/OFF operation according to the same control signal, i.e., the second control signal CNT2.

With the current detection circuit 100 according to the present embodiment, the voltage at the capacitor connection terminal 104 is output to the light-emitting control unit 340 as the detection voltage Vdet.

Figure 3:
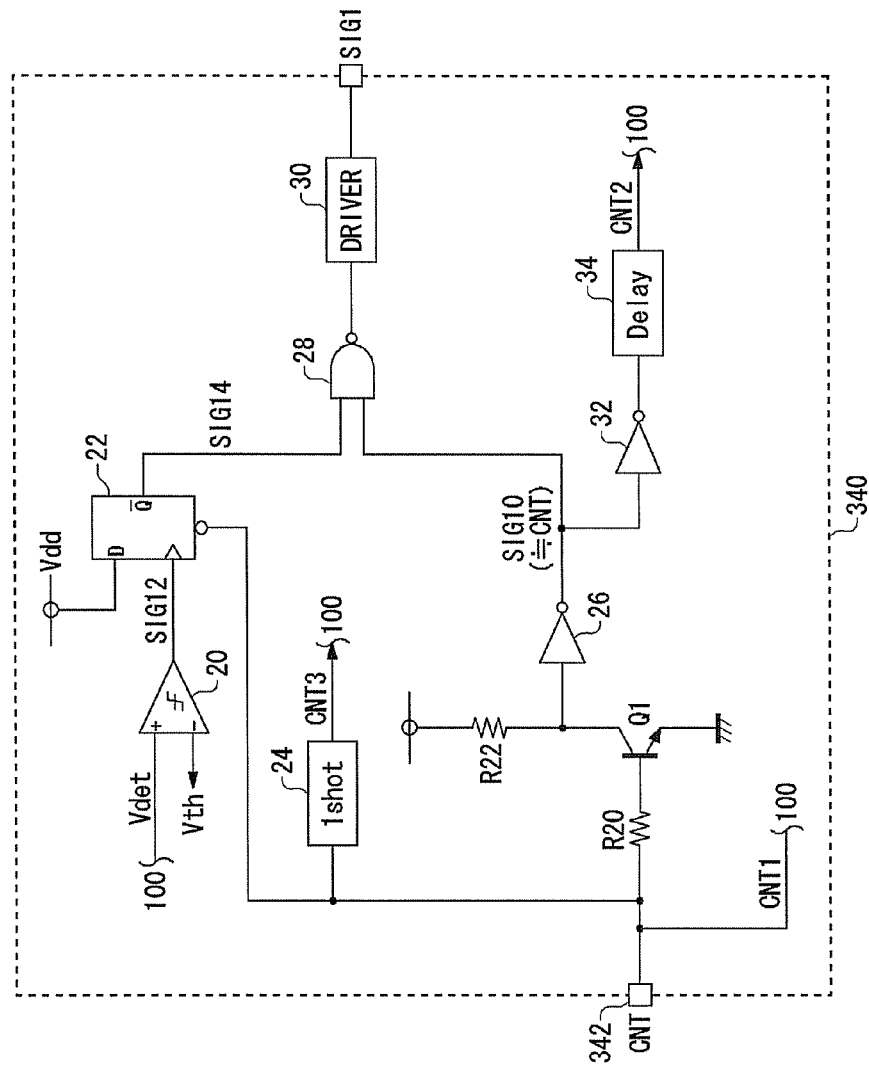
FIG. 3 is a circuit diagram which shows a configuration of a light-emitting control unit shown in FIG. 1.

Next, description will be made regarding a configuration of the light-emitting control unit 340. FIG. 3 is a circuit diagram which shows the configuration of the light-emitting control unit 340 according to the present embodiment. The light-emitting control unit 340 includes a comparator 20, a D-latch circuit 22, a one-shot circuit 24, a first inverter 26, a NAND gate 28, a driver circuit 30, a second inverter 32, and a delay circuit 34.

The light-emitting control unit 340 generates the first control signal CNT1 through the third control signal CNT3 according to the control signal CNT which is input to a control terminal 342, and which switches its signal level before the start of the light reception operation of the phototransistor 210. The first control signal CNT1 through the third control signal CNT3 thus generated are output to the current detection circuit 100. Furthermore, the light-emitting control unit 340 generates the light-emitting control signal SIG1 according to the control signal CNT and the detection voltage Vdet output from the current detection circuit 100, which controls the start and the stop of light emission of the light-emitting device 330.

First, description will be made regarding a block included in the light-emitting control unit 340, which has a function of generating the first control signal CNT1 through the third control signal CNT3.

The control signal CNT input to the control terminal 342 is output to the current detection circuit 100 as the first control signal CNT1 without any signal processing.

On the other hand, the second control signal CNT2 is generated by delaying the control signal CNT using resistors R20 and R22, the transistor Q1, the first inverter 26, the second inverter 32, and the delay circuit 34. The transistor Q1 is an NPN bipolar transistor, the emitter of which is grounded. Furthermore, the resistor R22 is provided between the collector of the transistor Q1 and the power supply line. The resistor R20 is connected between the base of the transistor Q1 and the control terminal 342.

The combination of the resistors R20 and R22 and the transistor Q1 performs logical inversion of the control signal CNT, and outputs the signal thus inverted. Furthermore, the first inverter 26 further performs logical inversion of the control signal CNT thus inverted.

The output signal SIG10 output from the first inverter 26 is input to the second inverter 32. The second inverter 32 performs logical inversion of the output signal SIG10 output from the first inverter 26, and outputs the signal thus inverted to the delay circuit 34. The delay circuit 34 delays the output signal output from the second inverter 32 by a predetermined period of time $\Delta T1$. The signal output from the delay circuit 34 is output to the current detection circuit 100 as the second control signal CNT2. The delay circuit 34 sets the delay period of time $\Delta T1$ to around 5 µs, for example.

The control signal CNT is input to the one-shot circuit 24, which switches its signal level prior to the start of the light reception operation of the phototransistor 210. The one-shot circuit 24 generates the third control signal CNT3 that maintains the high level state during a predetermined period of time $\Delta T2$ after the control signal CNT has switched to the high level state. That is to say, the one-shot circuit 24 serves as a latch circuit which latches the control signal CNT for the period of time $\Delta T2$. The third control signal CNT3 is output to the bias switch SW1, which controls the ON/OFF operation of the bias switch SW1. Here, the predetermined period of time $\Delta T2$ is greater than the delay time $\Delta T1$, which is set to around 10 µs, for example.

The light-emitting control unit 340 having the above-described configuration generates the first control signal CNT1 through the third control signal CNT3, and outputs these signals thus generated to the control detection circuit 100.

Next, description will be made regarding a block included in the light-emitting unit 340, which has a function of generating the light-emitting signal SIG1. This block includes the comparator 20, the D-latch circuit 22, the NAND gate 28, and the driver circuit 30.

The comparator 20 makes a comparison between the detection voltage Vdet output from the current detection circuit 100 and the predetermined threshold voltage Vth. In a case that Vdet is greater than Vth, the comparator 20 outputs a comparison signal SIG2 of the high level. On the other hand, in a case that Vdet is smaller than Vth, the comparator 20 outputs a comparison signal SIG2 of the low level.

The comparison signal SIG12 output from the comparator 20 is input to the clock terminal of the D-latch circuit 22. The data terminal of the D-latch circuit 22 is connected to the power supply line, which is fixed in the high level state. On the other hand, the control signal CNT is input to the reset terminal of the D-latch circuit 22. The D-latch circuit 22 serves as a latch circuit that provides a function whereby, upon reception of the positive edge of the comparison signal SIG12, the D-latch circuit 22 is set, and a function whereby, upon reception of the negative edge of the control signal CNT, the D-latch circuit 22 is reset. The inverted output signal SIG14 output from the D-latch circuit 22 is output to the NAND gate 28.

The NAND gate 28 outputs the NAND of the output signal SIG10 output from the first inverter 26 and the inverted output signal SIG14 output from the D-latch circuit 22. The driver circuit 30 outputs the light-emitting control signal SIG1 of the high level during a period of time when the output signal output from the NAND gate 28 is in the low level state.

Figure 4:
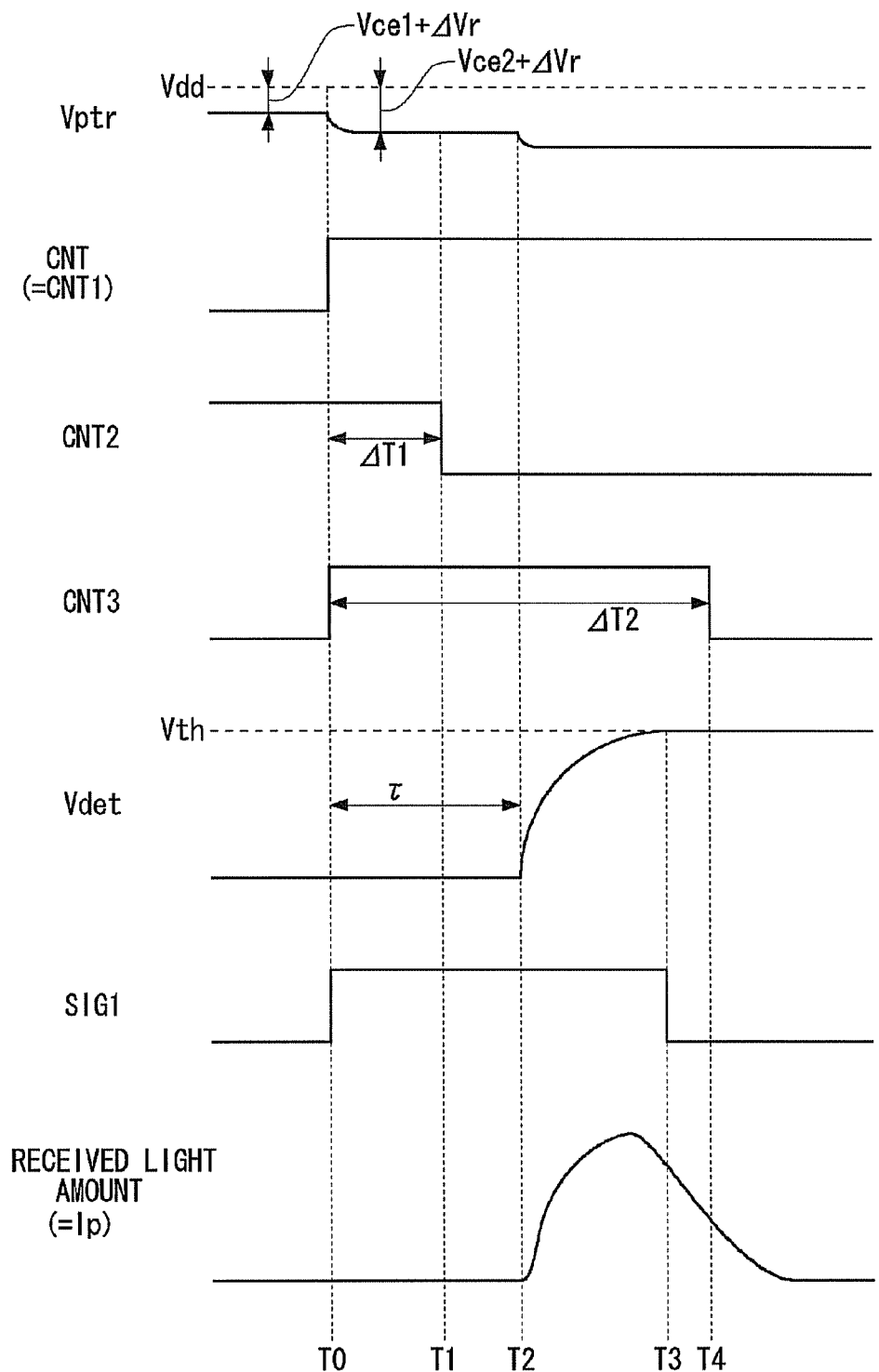
FIG. 4 is a time chart which shows the operation states of the electronic device shown in FIG. 1.

Description will be made regarding the operation of the current detection circuit 100 having the above-described configuration shown in FIG. 2 and the operation of the light-emitting control unit 340 having the above-described shown in FIG. 3. FIG. 4 is a time chart which shows the operation states of the current detection circuit 100 and the electronic device 300 according to the present embodiment.

Before the point in time T0, the power supply voltage Vdd is in the ON state, and accordingly, the current detection circuit 100 is in the standby state. During this standby state, an extremely small photocurrent Ip (dark current) flows through the phototransistor 210. The photocurrent Ip flows through the first transistor Q1 as the first current Iq1. With regard to the first transistor Q1, the base and the collector thereof are connected to each other, and accordingly, the collector-emitter voltage Vce is equal to the base-emitter voltage Vbe. In this state, the electric potential Vptr at the detection terminal 102 is obtained by subtracting the sum of the collector-emitter voltage Vce (=base-emitter voltage Vbe) of the first transistor Q1 and the voltage drop $\Delta Vr$ due to the first resistor R10 from the power supply voltage Vdd. That is to say, the electric potential Vptr at the detection terminal 102 is represented by Expression Vdd−Vce−$\Delta Vr$. In this stage, the photocurrent Ip that flows through the phototransistor 210 is small, and accordingly, the collector-emitter voltage Vce of the first transistor Q1 is also small.

At the point in time T0, the control signal CNT is switched to the high level state, which instructs the light-emitting device 330 to emit light. As described above, at the same time of switching of the control signal CNT to the high level state, the first control signal CNT1 is switched to the high level state. On the other hand, the third control signal CNT3 output from the one-shot circuit 24 is maintained at the high level state during the predetermined period of time $\Delta T2$ from the point in time T0.

Upon switching the first control signal CNT1 to the high level state at the point in time T0, the bypass switch SW2 is turned on, which provides a bypass of the second bias resistor Rbias2. On the other hand, upon switching the third control signal CNT3 to the high level state, the bias switch SW1 is turned on, which allows the bias current Ibias to flow through the bias current path 12.

In this stage, the current Iq1 that flows through the first transistor Q1 is represented by the sum of the photocurrent Ip and the bias current Ibias. That is to say, the current Iq that flows through the first transistor Q1 is represented by Expression Ip+Ibias. As described above, the resistor value of the first bias resistor Rbias1 is set to a value sufficiently lower than that of the second bias resistor Rbias2. Accordingly, in this stage, the first current Iq1 that flows through the first transistor Q1 increases. As a result, the collector-emitter voltage Vce of the first transistor Q1 increases as compared with that in a period before the point in time T0. Accordingly, the electric potential Vptr of the detection terminal 102 is lowered.

With the present embodiment, at the point in time T0 before the light emission operation of the light-emitting device 330, the bypass switch SW2 is turned on, which allows the bias current Ibias to flow through the bias current path 12, thereby increasing the first current Iq1. The increase of the first current Iq1 means that the collector current Ice of the first transistor Q1 increases.

Figure 5:
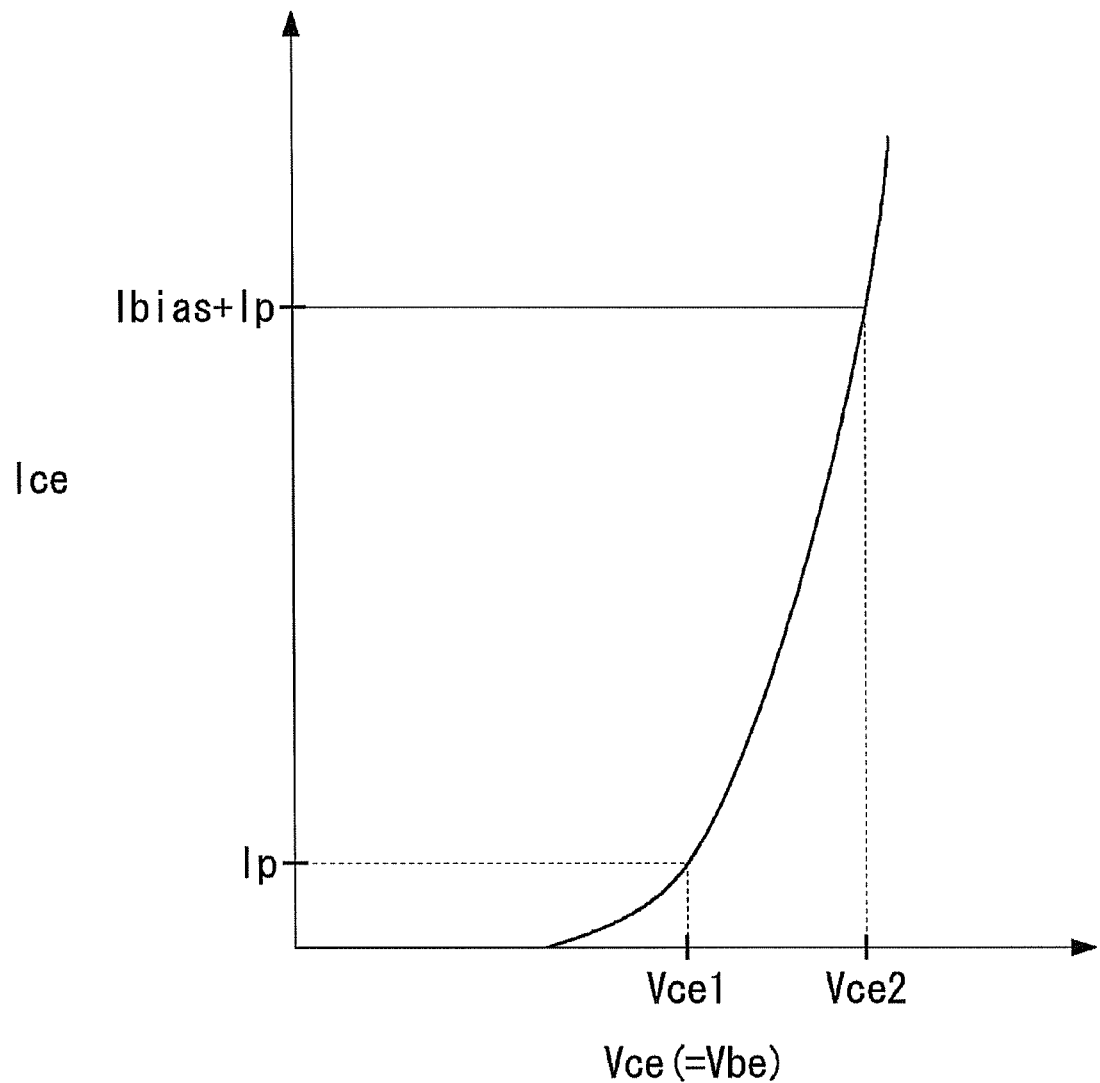
FIG. 5 is a diagram which shows the current characteristic of a first transistor which is a bipolar transistor.

FIG. 5 is a diagram which shows the current characteristic of the first transistor Q1 which is a bipolar transistor. In this drawing, the vertical axis represents the collector current Ice (=Iq1), and the horizontal axis represents the collector-emitter voltage Vce (=base-emitter voltage Vbe). As shown in FIG. 5, in a case that the collector current Ice (=Iq1) is small, the collector-emitter voltage fluctuates in a large range according to the fluctuation of the collector current Ice. On the other hand, in a case that the collector current Ice is large, the collector-emitter voltage exhibits small fluctuation according to the fluctuation of the collector current Ice.

Let us consider a case in which the first current Iq1 (collector current Ice) is small as in a period before the point in time T0. In this case, a minute change in the first current Iq1 leads to deviation of the collector voltage of the first transistor Q1, resulting in deviation of the voltage Vptr at the detection terminal 102. The deviation of the voltage Vptr at the detection terminal 102 leads to deviation of the bias state of the phototransistor 210. In some cases, this leads to fluctuation in the photocurrent Ip. Also, in some cases, the fluctuation in the voltage at the detection terminal 102 deteriorates the characteristic of the current mirror circuit including the first transistor Q1 and the second transistor Q2.

Accordingly, with the current detection circuit 100 according to the present embodiment, at the point in time T0 prior to the start of the light reception operation, the bias switch SW1 is turned on, which increases the first current Iq1. As a result, the first transistor Q1 is biased in a constant-current region where the collector-emitter voltage Vce exhibits reduced fluctuation according to the fluctuation in the collector current Ice. This maintains the voltage Vptr at the detection terminal 102 at a constant value. The constant voltage Vptr at the detection terminal 102 thus maintained also maintains the characteristic of the phototransistor 210. Furthermore, the constant voltage Vptr thus maintained also properly maintains the characteristic of the current mirror circuit including the first transistor Q1 and the second transistor Q2.

On the other hand, the second control signal CNT2 is latched, which maintains its signal state at the high level state during a period from the point in time T0 at which the control signal CNT transits from the low level state to the high level state up to the point in time T1 at which the predetermined period of time elapses. During the period in which the second control signal CNT2 is in the high level state, the discharge switch SW4 is in the ON state, which releases the charge stored in the charge capacitor Cchg, thereby initializing the charge capacitor Cchg. Furthermore, during the period in which the second control signal CNT2 is in the high level state, the mask switch is in the OFF state, and accordingly, the path for the second current Iq2 is in the OFF state. Accordingly, during a period before the point in time T1, the charge capacitor Cchg is not charged, and the detection voltage Vdet is fixed to the grounded potential even if the photocurrent Ip flows due to the light input to the phototransistor 210. With such an arrangement, in such a period, the circuit current is in the OFF state, thereby providing the advantage of low power consumption.

At the point in time T0, the light-emitting control signal SIG1 is switched to the high level state, which switches the light-emitting device 330 to the light-emitting-enabled state. The light-emitting device 330 according to the present embodiment emits light with a delay time τ after the light-emitting control signal SIG1 has been switched to the high level state. Accordingly, there is a need to set the aforementioned predetermined period of time ΔT1 to be smaller than the delay time τ.

Upon the second control signal CNT2 switching to the low level at the point in time T1, the mask switch SW is turned on, and the discharge switch SW4 is turned off, whereupon the current detection circuit 100 enters the standby state.

At the point in time T2 after the delay time τ from the point in time T0 at which the light-emitting control signal SIG1 has been switched to the high level state, the light-emitting device 330 emits light. After the light-emitting device 330 has emitted light, the reflected light is input to the phototransistor 210, whereupon the photocurrent Ip flows. At the point in time T2, the bias current path 12 is in the ON state, and accordingly, the first current Iq1 that flows through the first transistor Q1 is equal to the bias current Ibiasp. As described above, the first transistor Q1 is biased in the constant current region. Accordingly, almost no fluctuation occurs in the electric potential Vptr at the detection terminal 102 even if the photocurrent Ip starts flowing.

After the point in time T2, the charge capacitor Cchg is charged with the second current Iq2 output from the second transistor Q2, thereby gradually increasing the detection voltage Vdet. Upon the detection voltage Vdet reaching the predetermined threshold voltage Vth at the point in time T3, the comparison signal SIG12, which is an output signal of the comparator 20, is switched to the high level state, and accordingly, the inverted output signal SIG14 output from the D-latch circuit 22 is switched to the low level state. As a result, the light-emitting control signal SIG1 output from the driver circuit 30 is switched to the low level state. Accordingly, the light-emitting transistor 350 is turned off, whereupon the light-emitting device 330 stops light emission.

Subsequently, at the point in time T4 after the predetermined period of time ΔT2 from the point in time T0, the third control signal CNT3 is switched to the low level state, which turns off the bias switch SW1.

The current detection circuit 100 according to the present embodiment has a configuration in which the current mirror circuit is connected to the phototransistor 210 for duplicating the photocurrent, instead of a configuration in which a resistor is connected serially to the phototransistor 210. With such an arrangement, change in the photocurrent does not lead to significant fluctuation in the collector voltage of the first transistor Q1. Such an arrangement maintains the collector voltage Vptr of the phototransistor 210 at a constant value, thereby providing stable light detection. Furthermore, such an arrangement maintains the collector voltage of the phototransistor 210 at an approximately constant value, thereby providing a wide dynamic range.

Furthermore, with the current detection circuit 100 according to the present embodiment, prior to the start of the light emission of the light-emitting device 330, i.e., the start of the light reception operation of the phototransistor 210, the bias switch SW1 is turned on, thereby biasing the first transistor Q1, which is a component of the current mirror circuit, within the constant current region. Furthermore, this maintains the collector voltage of the phototransistor 210, i.e., the electric potential Vptr at the detection terminal 102, at an approximately constant value regardless of the value of the photocurrent Ip, thereby providing stable light detection.

Furthermore, with the present embodiment, the size of the second transistor Q2 is set to a value that is smaller than the size of the first transistor Q1. Such an arrangement reduces the second current Iq2 which is the output current of the current mirror circuit. This reduces current consumption of the circuit, and allows the charge capacitor Cchg to be designed with a reduced capacitance value.

Furthermore, the adjusting resistor Radj is provided in parallel with the second resistor R12, which allows the characteristic of the current detection circuit 100 to be adjusted according to the characteristic of and the irregularities in the phototransistor 210 connected to the detection terminal 102. This provides stable current detection. Furthermore, such an arrangement provides a method for adjusting the irregularities in the phototransistors, thereby improving the yield.

Furthermore, with the current detection circuit 100 according to the present embodiment, prior to the start of light emission of the light-emitting device 330, i.e., prior to the start of the light reception operation of the phototransistor 210, the bias switch SW1 is turned on, thereby biasing the first transistor Q1, which is a component of the current mirror circuit, within a constant current region. Furthermore, such an arrangement maintains the collector voltage of the phototransistor 210, i.e., the electric potential Vptr at the detection terminal 102, at an approximately constant value regardless of the value of the photocurrent Ip. This provides stable light detection.

Furthermore, with the present embodiment, the second bias resistor Rbias2 is provided. Such an arrangement maintains the impedance of the main current path 10 at a high value during a period before the light reception operation. This reduces current consumption of the circuit.

Figure 6:
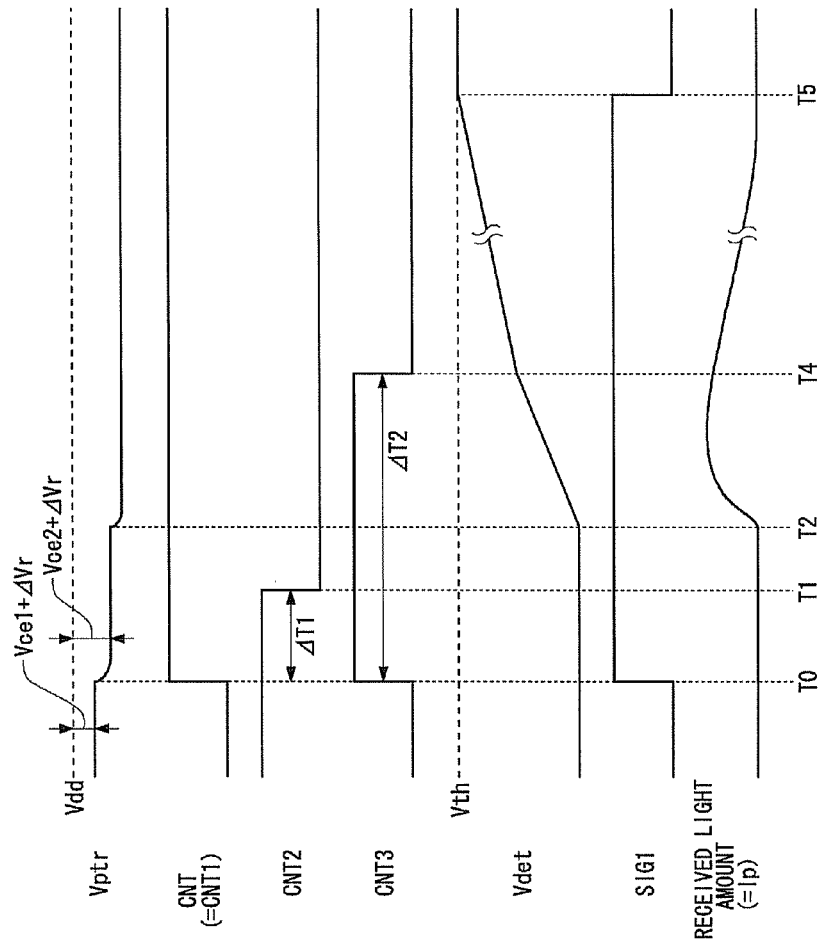
FIG. 6 is a time chart which shows the operation states of a current detection circuit and the electronic device when the phototransistor receives a small amount of light.

FIG. 6 is a time chart which shows the operation states of the current detection circuit 100 and the electronic device 300 when the phototransistor 210 receives a small amount of light.

The waveforms during a period before the start of the light reception operation of the phototransistor 210, i.e., during a period from the point in time T0 up to the point in time T2, are the same as those shown in FIG. 4. At the point in time T2 after the delay time τ from the point in time T0 at which the control signal CNT is switched to the high level state, the light-emitting device 330 emits light. In a case that the distance between the light-emitting device 330 and the object that reflects the light is great, the intensity of the reflected light is small, leading to a small amount of received light. As a result, the photocurrent Ip is smaller than that shown in FIG. 4, leading to a reduced rate of increase in the detection voltage Vdet. During the period from the point in time T2 up to the point in time T4, the first current Iq1 is the sum of the photocurrent Ip and the bias current Ibias.

At the point in time T4 after the predetermined period of time ΔT2 from the point in time T0, the third control signal CNT3 is switched to the low level state. In this stage, the bias switch SW1 is turned off, and the bias current path 12 is switched to the OFF state. After the point in time T4, the bias switch SW1 is maintained in the OFF state, which does not permit the bias current Ibias to flow. Accordingly, the first current Iq1 that flows through the first transistor Q1 is equal to the photocurrent Ip. As a result, the charge current, which is used for charging the charge capacitor Cchg, is reduced, thereby reducing the rate in increase in the detection voltage Vdet.

Subsequently, at the point in time T5, the detection voltage Vdet reaches the threshold voltage Vth. In this stage, the light-emitting control signal SIG1 is switched to the low level state, which stops the light emission of the light-emitting device 330.

The light reception operation during a period of time that exceeds a predetermined period of time (which corresponds to (ΔT2−τ) in the present embodiment) means that the rate of increase in the detection voltage Vdet is small, which means that the photocurrent Ip is small. Now, let us consider a case in which the photocurrent Ip is almost equal to or is smaller than the bias current Ibias. Furthermore, let us consider a case in which the charge capacitor Cchg is charged with the first current Iq1 (=Ip+Ibias). In this case, the amount of light thus received cannot be obtained with sufficient precision by integration of the first current Iq1.

With the photo detector device 200 and the light-emitting control unit 340 according to the present embodiment, the bias switch SW1 is maintained in the OFF state after the predetermined period of time (ΔT2−τ), which sets the first current Iq1 to be equal to the photocurrent Ip. Such an arrangement enables the phototransistor 210 to detect the amount of received light with high precision, thereby properly controlling the period of time up to the point in time at which the light-emitting device 330 is to be turned off.

Note that, at the point in time T4, the photocurrent Ip flows through the first transistor Q1. Accordingly, the bias state of the first transistor Q1 is not reduced to a non-constant current region even if the bias current Ibias is turned off. This ensures that there is no great change in the electric potential Vptr at the detection terminal 102.

Furthermore, with the photo detector device 200 and the light-emitting control unit 340 according to the present embodiment, the discharge switch SW4 and the mask switch SW3 are provided. Such an arrangement provides the following advantages.

Let us consider an arrangement in which the power supply voltage is applied to the current detection circuit 100 so as to bias the phototransistor 210. With such an arrangement, in some case, the charge capacitor Cchg is charged with the dark current or the photocurrent Ip due to the unintended light which is input externally, and which should not be input. In order to solve such a problem, with the present embodiment, prior to the start of the light reception operation of the phototransistor 210, the discharge switch SW4 is maintained in the ON-state during a predetermined period of time. This prevents the discharge capacitor Cchg from being charged with the undesired current. Furthermore, such an arrangement releases the charge stored in the charge capacitor Cchg, thereby setting the detection voltage Vdet to the initial value. Furthermore, with the present embodiment, prior to the start of the light reception operation of the phototransistor 210, the mask switch SW3 is maintained in the OFF state, which prevent the charge capacitor Cchg from being charged with the second current Iq2. Also, such an arrangement reduces current consumption of the circuit.

Furthermore, with the present embodiment, the D-latch circuit 22 latches the comparison signal SIG12 output from the comparator 20. Now, let us consider a case in which the detection voltage Vdet fluctuates near the threshold voltage Vth. Even in such a case, such an arrangement prevents a situation in which the light-emitting signal SIG1 repeatedly switches between the high level state and the low level state. Thus, such an arrangement prevents the light-emitting device 330 from repeatedly switching between the light-emission ON state and the light-emission OFF state.

The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention.

Description has been made in the embodiment regarding an arrangement in which the second transistor Q2 is provided with a smaller size than that of the first transistor Q1. However, the present invention is not restricted to such an arrangement. Let us consider an arrangement in which the size of the phototransistor 210 is extremely small, which provides a small amount of photocurrent Ip. Also, let us consider an arrangement in which the capacitance value of the discharge capacitor Cchg is small. With such an arrangement, the second transistor Q2 may be provided with a greater size than that of the first transistor Q1, which provides current amplification. With such an arrangement, the resistance value of the second resistor R12 is preferably set to a smaller value than that of the first resistor R10.

Description has been made in the embodiment regarding an arrangement in which the bias current path 12 is formed of the first bias resistor Rbias and the bias switch SW1 connected serially. However, the present invention is not restricted to such an arrangement. Also, a constant current source that generates a predetermined current may be employed. With such an arrangement, the bias state of the first transistor Q1 can be switched by switching the constant current source between the ON state and the OFF state.

Description has been made in the embodiment regarding an arrangement employing the phototransistor 210 as a photo detector device. Also, a photodiode may be employed instead of the phototransistor 210.

Description has been made in the embodiment regarding an arrangement including components such as MOSFETs and bipolar transistors. These components are interchangeable. Such interchanging should be determined based upon the semiconductor manufacturing process, costs, and the demanded usage of the circuit. Furthermore, an arrangement may be made having an inverted relation between the power supply voltage and the grounded electric potential as to that in the present embodiment. With such an arrangement, each PNP transistor is replaced by a corresponding NPN transistor. Furthermore, each NPN transistor is replaced by a corresponding PNP transistor. Furthermore, each PMOS transistor is replaced by a corresponding NMOS transistor. Furthermore, each NMOS transistor is replaced by a corresponding PMOS transistor. Such a circuit configuration effectively operates according to the present invention.

Description has been made in the embodiment regarding an arrangement in which the photo detector device 200 and the light-emitting control unit 340 are integrally formed. Also, a part thereof may be provided in the form of a discrete component. Which part is to be provided in the form of an integrated circuit should be determined based upon costs, the occupied area, usage, etc.

The application of the current detection circuit 100 or the electronic device 300 employing the photo detector device 200 according to the present embodiment is not restricted to the aforementioned cellular phone terminal. Also, the current detection circuit 100 or the electronic device 300 employing the photo detector device 200 according to the present embodiment can be widely employed in various devices which detect light using a photodiode or a phototransistor, such as a luminescence sensor, an infrared ray remote controller, etc.

The present invention has been described with reference to the embodiments. It is needless to say that the above-described embodiments represent only principles or applications of the present invention. Accordingly, it is needless to say that various modifications and changes may be made without departing from the spirit of the present invention.

While the preferred embodiments of the present invention have been described using specific terms, such description is for illustrative purposes only, and it is to be understood that changes and variations may be made without departing from the spirit or scope of the appended claims.

The invention claimed is:

1. A current detection circuit for detecting photocurrent that flows through a photo detector device, comprising:
    a first transistor provided on a path of the photocurrent, the first transistor being in series with said photo detector device;
    a first resistor provided between one terminal of said first transistor and a terminal to which a fixed electric potential is applied;
    a second transistor which forms a current mirror circuit in cooperation with said first transistor, a control terminal of said second transistor being connected to a control terminal of the first transistor, and which amplifies by a predetermined amplification factor the current that flows through said first transistor, and which provides the current thus amplified as the output of said current detection circuit; and
    a second resistor provided between one terminal of said second transistor and a terminal to which a fixed electric potential is applied.

2. A current detection circuit according to claim 1, further comprising an adjusting resistor connected in parallel with said second resistor.

3. A current detection circuit according to claim 1, wherein the size of said second transistor is set to a value smaller than that of said first transistor,
    and wherein the resistance value of said second resistor is set to a value greater than that of said first resistor.

4. A current detection circuit according to claim 1, wherein a capacitor is charged with the current that flows through said second transistor, which is output in the form of voltage thus converted.

5. A current detection circuit according to claim 1, wherein said first transistor, said second transistor, said first resistor, and said second resistor are integrally formed on a single semiconductor substrate,
    and wherein said adjusting resistor is connected in the form of an external component of the semiconductor substrate.

6. A photo detecting apparatus comprising:
    a photo detector device; and
    a current detection circuit that detects photocurrent that flows through said photo detector device, the current detection circuit comprising:
        a first transistor provided on a path of the photocurrent, the first transistor being in series with said photo detector device;
        a first resistor provided between one terminal of said first transistor and a terminal to which a fixed electric potential is applied;
        a second transistor which forms a current mirror circuit in cooperation with said first transistor, a control terminal of said second transistor being connected to a control terminal of the first transistor, and which amplifies by a predetermined amplification factor the current that flows through said first transistor, and which provides the current thus amplified as the output of said current detection circuit; and
        a second resistor provided between one terminal of said second transistor and a terminal to which a fixed electric potential is applied.

7. A photo detecting apparatus according to claim 6, wherein said photo detector device comprises a phototransistor.

8. A photo detecting apparatus according to claim 6, wherein said photo detector device comprises a photodiode.

9. An electronic device comprising:
    a light-emitting device; and
    a photo detecting apparatus according that detects light that has been emitted from said light-emitting device, and that has been reflected by an external object, the photo detecting apparatus comprising:
        a photo detector device; and
        a current detection circuit that detects photocurrent that flows through said photo detector device, the current detection circuit comprising:

a first transistor provided on a path of the photocurrent, the first transistor being in series with said photo detector device;

a first resistor provided between one terminal of said first transistor and a terminal to which a fixed electric potential is applied;

a second transistor which forms a current mirror circuit in cooperation with said first transistor, a control terminal of said second transistor being connected to a control terminal of the first transistor, and which amplifies by a predetermined amplification factor the current that flows through said first transistor, and which provides the current thus amplified as the output of said current detection circuit; and a second resistor provided between one terminal of said second transistor and a terminal to which a fixed electric potential is applied.

10. An electronic device according to claim 9, wherein, upon the light amount of the reflected light detected by said photo detecting apparatus reaching a predetermined value, said light-emitting device stops light emission.

* * * * *